United States Patent [19]

Bard

[11] 4,038,608
[45] July 26, 1977

[54] REDUNDANT OSCILLATOR FOR CLOCKING SIGNAL SOURCE

[75] Inventor: Howard B. Bard, Chula Vista, Calif.

[73] Assignee: The United States of America as represented by the Secretary of the Navy, Washington, D.C.

[21] Appl. No.: 684,506

[22] Filed: May 7, 1976

[51] Int. Cl.² .................................................. H03B 5/12
[52] U.S. Cl. ........................................ 331/56; 307/219; 331/117 R
[58] Field of Search .................... 307/219; 331/55, 56, 331/57, 117, 113.1

[56] References Cited

U.S. PATENT DOCUMENTS

| | | | |
|---|---|---|---|
| 2,177,272 | 10/1939 | Zottu | 331/56 |
| 2,497,854 | 2/1950 | Baller | 331/56 |
| 3,042,870 | 7/1962 | Minner et al. | 331/117 |
| 3,136,957 | 6/1964 | Putkovich et al. | 331/56 |
| 3,139,530 | 6/1964 | De Motte | 331/56 |
| 3,164,784 | 1/1965 | Jennings | 331/113.1 |

*Primary Examiner*—John Kominski
*Attorney, Agent, or Firm*—R. S. Sciascia; G. J. Rubens; T. M. Phillips

[57] ABSTRACT

A plurality of transistor energy generators are coupled to a common high Q, torroid tuned circuit. Each energy generator has its own separate power supply and the output signal is derived by a common coil coupled to the tuned circuit.

3 Claims, 1 Drawing Figure

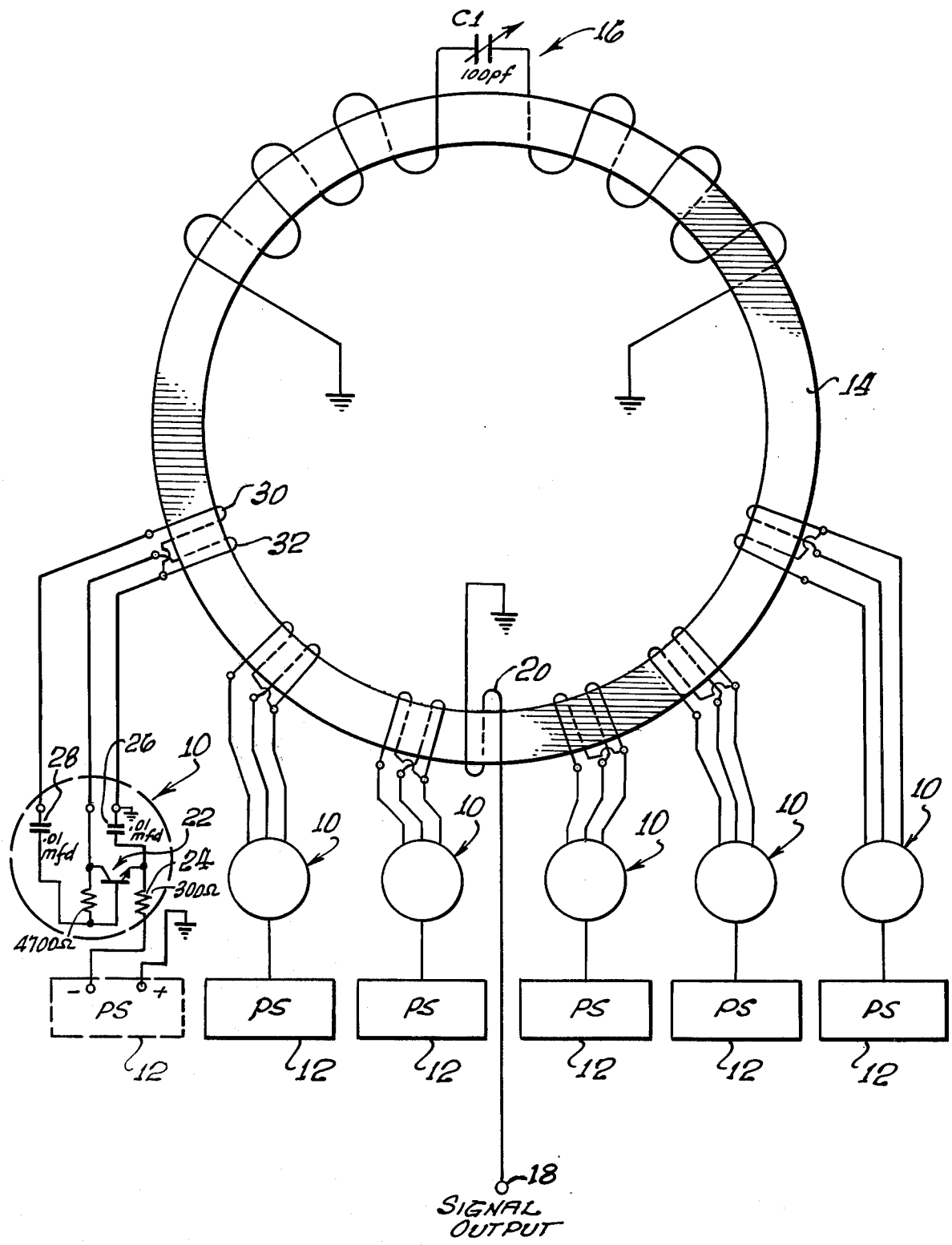

REDUNDANT OSCILLATOR FOR CLOCKING SIGNAL SOURCE

BACKGROUND OF THE INVENTION

Many systems, such as computer systems used in complex communication systems, for instance, require a continuous and uninterrupted series of accurately timed periodic clock pulses for synchronization purposes. The loss of a single clock pulse may be fatal to the transmission of data. Many of the redundant oscillator systems of the prior art utilize standby oscillators or redundant oscillators which must be synchronized in order that there will be no loss of clock pulses in the event of a transition from the master oscillator to the standby oscillator. Or in other situations no redundancy is provided with the loss of the single oscillator clock source causes complete loss of timing synchronization.

SUMMARY OF THE INVENTION

The present invention provides for a redundant clocking signal source wherein a plurality of energy generators are coupled to a common high Q resonant tank circuit. Since all energy generators are substantially identical, the failure of one generator will not interrupt the flow of clocking signals. The problem of synchronization is also avoided. Each energy generator has its own separate power supply and the output signal is derived by a common coil coupled to the resonant tank circuit.

Accordingly, an object of the invention is the provision of a redundant oscillator for providing an ultra reliable clocking signal source.

Other objects and many of the attendant advantages of this invention will be readily appreciated as the same becomes better understood by reference to the following detailed description when considered in connection with the accompanying drawing where there is shown in the single figure a schematic diagram of the preferred embodiment of the invention.

DESCRIPTION OF THE PREFERRED EMBODIMENT

Referring now to the drawing, there are shown six transistor energy generators 10 each having its own power supply 12. Each of the generators are coupled by means of a torrid 14 to a common high Q tuned circuit 16. The number of transistor energy generators shown are six since it has been found that up to three generators can be disabled without affecting the amplitude of the output signal. The output signal at terminal 18 is derived by a common coil 20 coupled to the tuned circuit.

Each transistor energy generator consists of a transistor 22 having its emitter connected to the negative terminal of a power supply through a 300 ohm resister 24 and to ground through a capacitor 26. The base of transistor 22 is coupled through a capacitor 28 to the exciter coil 30 while the collector is connected directly to the drive coil 32.

Resonant tank circuit 16 consists of a resonator coil having an in line variable capacitor C1.

In practice and in operation each power supply 12 may be a battery or any other convenient separate source. With the values shown and using a 2N918 transistor with a 15 volt power supply at 30 ma an output signal of 2 volts RMS wiht 50 ohm loading at a resonant frequency of 12Mhz was realized.

Obviously many modifications and variations of the present invention are possible in the light of the above teachings. It is therefore to be understood that within the scope of the appended claims the invention may be practiced otherwise than as specifically described.

What is claimed is:
1. A redundant clocking signal source comprising:
   a. a plurality of energy generators, each having a separate power source,
   b. a High Q tank circuit,
   c. a torroid core of magnetic material mutually coupling said energy generators to said resonant tank circuit,
   d. an output circuit means mutually coupled by means of said torroid core to said plurality of energy generators and providing and maintaining an output signal of a predetermined frequency when there is failure of at least one of said energy generators.
2. The device as recited in claim 1 wherein each of said energy generators comprises a transistor energy generator having an exciter coil and a drive coil wound on said torroid core.
3. The device as recited in claim 1 wherein each of said generators comprises:
   a. a source of d.c. voltage having its positive terminal connected to ground,
   b. a transistor having a base, emitter and a collector,
   c. an exciter coil wound on said torroid core and being connected in circuit with a capacitor to said base and to ground,
   d. a drive coil wound on said torroid core and being connected between said collector and ground,
   e. a capacitor and resistor connected in circuit between the negative terminal of said power source and ground,
   f. said emitter being connected to a junction intermediate said capacitor and said resistor.

* * * * *